(12) United States Patent
Kuroda et al.

(10) Patent No.: US 6,640,433 B1
(45) Date of Patent: Nov. 4, 2003

(54) METHOD FOR FORMING A MICRO-PATTERN

(75) Inventors: Ryo Kuroda, Kawasaki (JP); Hiroshi Matsuda, Isehara (JP); Kiyoshi Takimoto, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/076,235

(22) Filed: May 12, 1998

(30) Foreign Application Priority Data

May 13, 1997 (JP) .............................. 9-137594

(51) Int. Cl.[7] .............................. H05K 3/02; H05K 3/10
(52) U.S. Cl. .............................. 29/846; 29/825; 29/853; 428/216
(58) Field of Search .................... 29/825, 846, 853; 428/216

(56) References Cited

U.S. PATENT DOCUMENTS

| | | | | |
|---|---|---|---|---|
| 3,346,950 A | * | 10/1967 | Schick | 29/853 |
| 4,343,993 A | * | 8/1982 | Binning et al. | 250/306 |
| 4,785,189 A | * | 11/1988 | Wells | 250/492.2 |
| 4,835,083 A | * | 5/1989 | Sakai et al. | 430/130 |
| 4,916,002 A | * | 4/1990 | Carver | 428/139 |
| 5,071,694 A | * | 12/1991 | Uekita et al. | 428/216 |
| 5,072,116 A | | 12/1991 | Kawade et al. | 250/306 |
| 5,229,845 A | * | 7/1993 | Ueba et al. | 257/40 |
| 5,255,258 A | | 10/1993 | Kawade et al. | 369/126 |
| 5,478,456 A | * | 12/1995 | Humpal et al. | 204/192.13 |
| 5,506,829 A | * | 4/1996 | Yagi et al. | 369/126 |
| 5,546,375 A | * | 8/1996 | Shimada et al. | 369/126 |
| 5,717,680 A | | 2/1998 | Yamano et al. | 369/126 |

FOREIGN PATENT DOCUMENTS

| | | | |
|---|---|---|---|
| JP | 60-217240 | * | 10/1985 |
| JP | 63-161552 | * | 7/1988 |
| JP | 63-161553 | * | 7/1988 |
| JP | 05-074403 | * | 3/1993 |
| JP | 05-217861 | * | 9/1993 |
| JP | 6-119901 | | 4/1994 |
| JP | 6-151392 | * | 5/1994 |
| JP | 06-291031 | * | 10/1994 |
| JP | 8-104810 | | 4/1996 |
| JP | 08-244272 | * | 9/1996 |

* cited by examiner

Primary Examiner—Richard Chang
(74) Attorney, Agent, or Firm—Fitzpatrick, Cella, Harper & Scinto

(57) ABSTRACT

The method of forming a micro-pattern comprising forming an organic thin film by building up monomolecular films on an insulating substrate; heating and baking the organic thin film to turn the organic thin film into an amorphous carbon or graphite film, thereby providing an electroconductive thin film; and processing the organic thin film by conducting a microcutting work on it while holding a probe in contact with the organic thin film by means of atomic force to produce the micro-pattern.

5 Claims, 12 Drawing Sheets

METHOD FOR FORMING A MICRO-PATTERN

BACKGROUND OF THE INVENTION

1. Field of the Invention

This invention relates to a method of forming an electroconductive micro-pattern and also to a device having such an electroconductive micro-pattern. More particularly, it relates to a method of forming an electroconductive micro-pattern for an electronic circuit device having an ultramicro-structure and also to an electric device having such an electroconductive ultramicro-structure.

2. Related Background Art

Ultralarge scale integrated circuit devices including large-capacity random access memories and high speed CPUs have been developed in the course of the remarkable technological advancement in the field of semiconductors in recent years and they are currently taking an indispensable role in this modern society, which is often described as highly advanced telecommunication society. However, there still is an ever increasing demand for devices of the above identified category that have an greater capacity and/or provide a higher processing speed. Since the known technologies for producing and processing semiconductor materials cannot cope with such a demand, efforts have been paid to develop totally new technologies that can effectively be used to meet the demand.

Research efforts have been paid for electron devices operating on the basis of novel theories relating to the quantum effect that micro-structures in the order of nanometers can provide as such micro-structures are expected to take a vital role in the electronic technologies of the next generation. Micro-structures are so important for quantum effect electron devices and such a micro-structure is also referred to as a quantum dot or a quantum wire depending on the configuration and has a size of 100 nanometers, or substantially equal to the wavelength of an electron wave, or less. In particular, micro-structures less than 30 nanometers are required for devices that should operate properly at room temperature.

In an attempt to satisfy the above requirement, various micro-working processes involving the use of an electron beam lithography apparatus and/or a focused ion beam working apparatus have been proposed, although it is difficult to manufacture micro-patterns having a size less than 30 nanometers reliably with any of such processes on a high reproducibility basis.

Meanwhile, techniques have been proposed to draw a fine pattern by means of a scanning tunneling microscope (STM) adapted to observe an electroconductive minute object with a resolution less than a nanometer. For example, U.S. Pat. No. 4,785,189 discloses a low energy electron beam lithography apparatus comprising an STM construction. With the proposed apparatus, a probe having a sharp tip is brought close to a piece of electron beam-sensitive resist placed on an electroconductive thin film on a substrate in order to draw a pattern on the resist by irradiating a low energy electron beam.

Japanese Patent Application Laid-Open No. 6-119901 describes a micro-working process for directly processing an electroconductive specimen by means of an STM probe without using resist.

An atomic force microscope (AFM) makes it possible to observe an insulator specimen with a resolution less than a nanometer and micro-working processes utilizing an AFM have also been proposed (see inter alia, Japanese Patent Application Laid-Open Nos. 6-151392 and 6-291031). The AFM does not require the specimen to be electroconductive and hence can be used to process various insulator specimens including those made of resist. Thus, AFMs are expected to be used for a wide variety of applications.

Generally, as pointed out above, an electroconductive micro-structure having a size less than 30 nanometers has to be prepared on an insulator in order to realize a quantum effect electron device that operates properly at room temperatures. However, if the structure contains an insulating part therein, the micro-working process using an STM probe becomes inoperative there for detecting a tunnel current and hence for controlling the distance between the probe and the specimen. Then, as a result, the process will not proceed continuously and smoothly.

Of the above described processing techniques, those adapted for cutting a piece of resist placed on a substrate to form a resist pattern with the probe of an STM or an AFM and preparing a micro-structure on the substrate by means of a developing process or some other equivalent process using the resist pattern as mask can often experience a problem of a warped pattern during the developing process that results in an inability of producing a desired micro-structure.

SUMMARY OF THE INVENTION

In view of the above identified problems of the known technologies, it is therefore an object of the present invention to provide a method of forming a micro-pattern that is adapted to produce a micro-pattern on an insulating substrate on a high reproducibility basis. Another object of the invention is to provide an electric device operating as a quantum effect electron device having such a micro-pattern.

According to an aspect of the invention, the first object is achieved by providing a method of forming a micro-pattern comprising steps of:

forming an organic thin film on an insulating substrate;

processing said organic thin film by conducting a micro-cutting work on it, holding a probe in contact with said organic thin film by means of atomic force; and producing an electroconductive thin film out of said organic thin film subjected to the cutting work by heating and baking it.

According to another aspect of the invention, the first object is also achieved by providing a method of forming a micro-pattern comprising steps of:

forming an organic thin film on an insulating substrate;

producing an electroconductive thin film out of said organic thin film by heating and baking it; and processing said electroconductive thin film by conducting a micro-cutting work on it, holding a probe in contact with said electroconductive thin film by means of atomic force.

According to still another aspect of the invention, the second object is achieved by providing an electric device formed by means of either of the above methods of forming a micro-pattern.

The present invention will be described hereinafter by referring to the accompanying drawings illustrating preferred modes of carrying out the invention.

DESCRIPTION OF THE PREFERRED EMBODIMENTS

Now, the present invention will be described in terms of preferred embodiments.

First Embodiment

Figure 1:
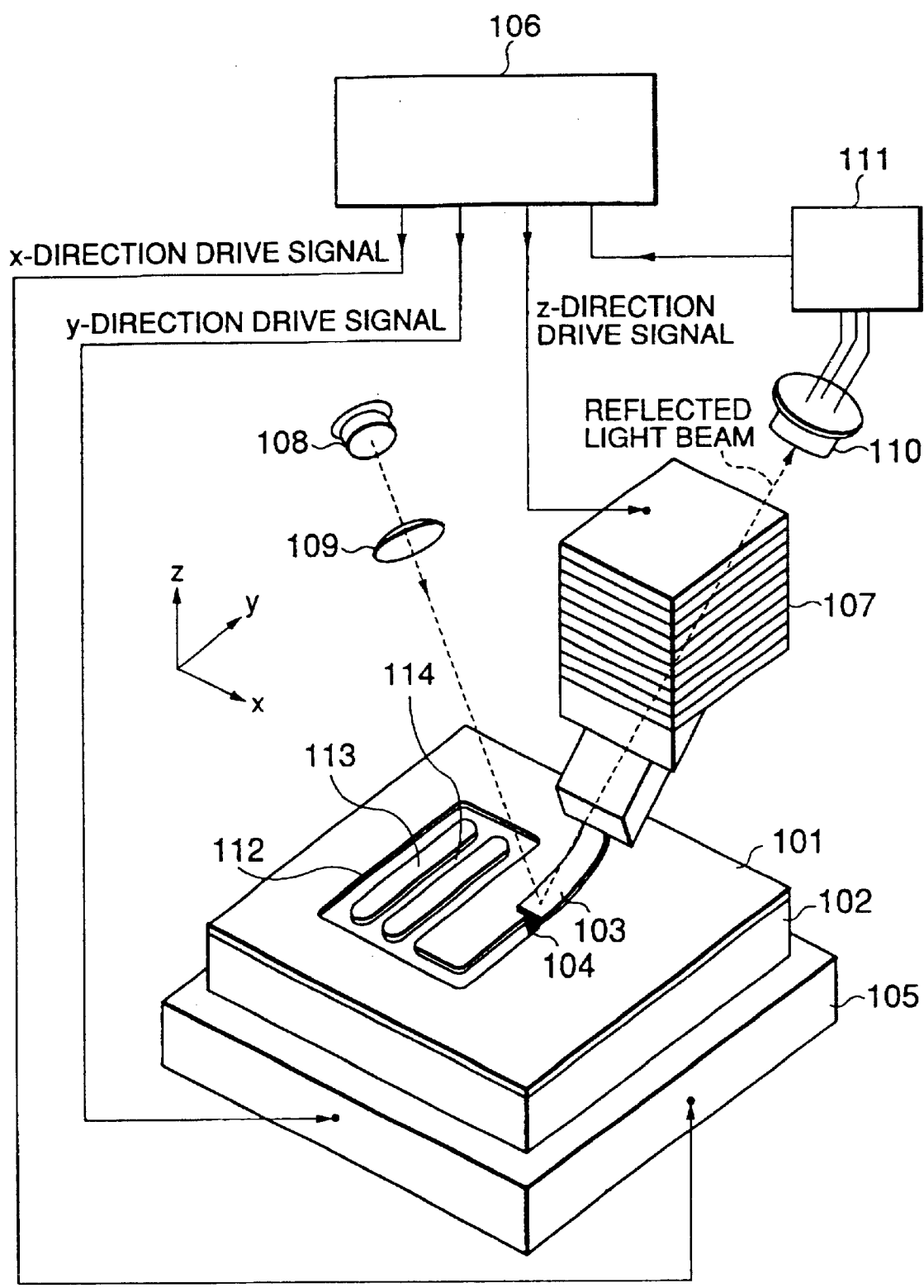
FIG. 1 is a schematic perspective view of a processing system for carrying out a method of forming an electroconductive micro-pattern according to the invention.

FIG. 1 shows the characteristic features of the present invention. Now, a micro-working process that can be used for the purpose of the invention will be described by referring to FIG. 1.

In FIG. 1, there are shown an insulating substrate 102, an electroconductive thin film 101 arranged on the insulating substrate and a cantilever 103 provided at the free end thereof with a probe 104, which can be moved along the z-direction shown in FIG. 1 as the free end of the cantilever is deflected in that direction.

Preferably, the insulating substrate 102 is made of an electrically insulating material with a smooth surface such as a cleavage surface or a polished surface having a flatness in the order of nanometers. Materials that can be used for the insulating substrate include quartz, sapphire, glass, silicon (Si) and GaAs. The electroconductive thin film 101 is made of an electroconductive material less hard than that of the insulating substrate and has a film thickness of about 10 nm. The process of preparing the thin film will be described in detail hereinafter. On the other hand, the probe 104 is made of a material harder than that of the electroconductive thin film 101 and adapted to show a sharp tip. Materials that can be used for the probe 104 include diamond, SiC, Si, $SiO_2$ and $Si_3N_4$. From the viewpoint of preparing a micro-pattern for the purpose of the present invention, the tip of the probe 104 shows a radius of curvature of 30 nm or less, preferably 10 nm or less.

The cantilever 103 is fitted to a z-directional drive device 107, which drives the cantilever 103 to move along the z-direction according to a z-directional drive signal transmitted from a computer 106. With this arrangement, the tip of the probe 104 can be held in contact with the electroconductive thin film 101 to apply a predetermined contact force to the latter.

The contact force between the tip of the probe 104 and the electroconductive thin film 101 is detected in a manner as described below. A laser beam emitted from a laser source 108 is made to irradiate the rear surface (opposite to the surface located vis-a-vis the electroconductive thin film) of the tip of the cantilever 103 by way of a lens 109 and the reflected beam coming from the cantilever 103 is made to strike a dichotomizing photodiode 110. The differential output of the dichotomizing photodiode 110 is then applied to a differential signal computation circuit 111 and the output of the latter is sent to the computer 106. The computer 106 then determines the angular variation of the reflected beam from the displacement of the beam spot of the reflected beam on the dichotomizing photodiode 110 and also the z-directional deflection $\Delta z$ of the cantilever 103. If the modulus of elasticity of the cantilever 103 is k for its deflection, the contact force between the tip of the probe 104 and the electroconductive thin film 101 is expressed by $k\Delta z$.

Thus, it is possible to set the contact force between the tip of the probe 104 and the electroconductive thin film 101 to a predetermined value by detecting it and operating the z-directional drive device 107.

The insulating substrate 102 is secured onto an x-y stage 105, which is driven by x- and y-directional drive signals sent from the computer 106 to move the electroconductive thin film 101 and the insulating substrate 102 relative to the probe 104 along the x- and y-directions.

Figure 3:
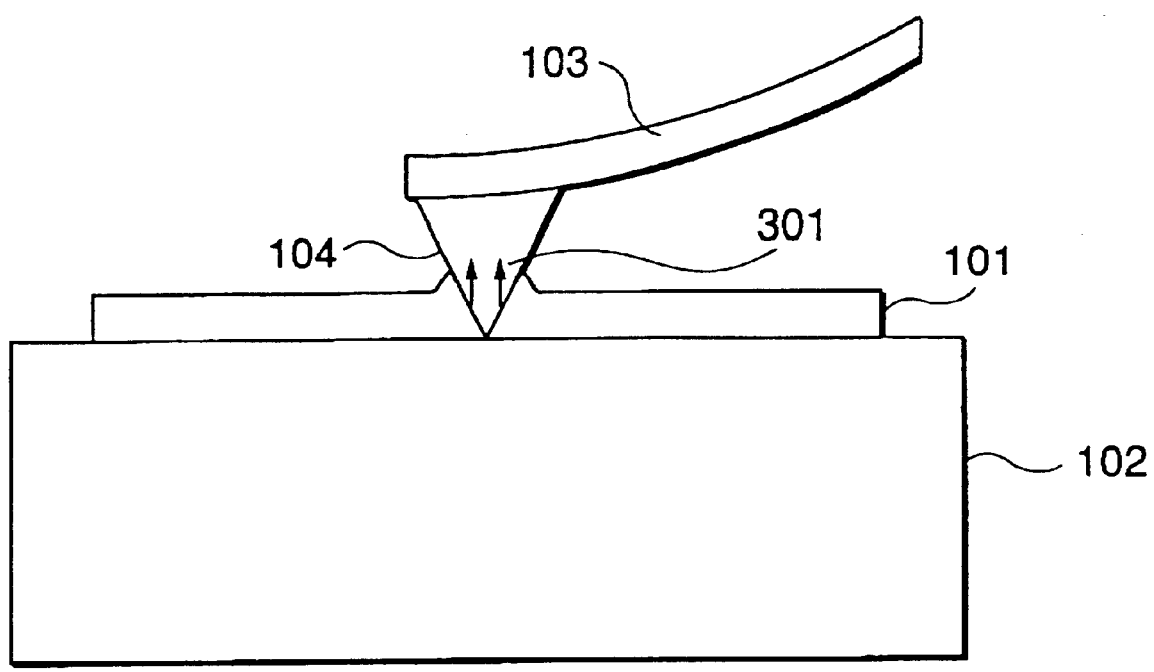
FIG. 3 is a schematic side view of a thin film being subjected to a micro-cutting work, using a method according to the invention.

Referring to FIG. 3, as the x-y stage 105 is driven in the x- and y-directions, a contact force is being applied to the tip of the probe 104 to such an extent that the tip moves into the electroconductive thin film 101 until it gets to the surface of the insulating substrate 102. Then, as a result, the electroconductive thin film 101 is cut by the tip of the probe 104 to produce a micro-worked pattern 112.

It will be appreciated that a desired micro-worked pattern can be prepared by appropriately combining micro-wires and micro-grooves according to the x- and y-directional drive signals fed from the computer 106.

The tip of the probe 104 can be correctly aligned with the electroconductive thin film 101 in the x- and y-directions before preparing a micro-worked pattern by utilizing the AFM theorem as described in Japanese Patent Applications Laid-Open Nos. 05-74403 and 05-217861. For the purpose of the invention, the probe 104 is made to scan the electroconductive thin film 101 in the x- and y-directions with a contact force reduced to a level at which no cutting takes place, while the displacement of the cantilever 103 is traced under this condition to detect the surface profile of the electroconductive thin film 101 or the aligning markers arranged on it. Subsequently, the location at which the electroconductive thin film is to be micro-worked is determined on the basis of the detected surface profile or the positions of the detected markers and then the probe is moved to that location. Thereafter, the contact force is raised to a level required for carrying out a micro-cutting operation in the micro-working process.

The smallest width of the micro-wires/grooves of the micro-worked pattern prepared by the above described micro-pattern forming method is determined by the factors relating to the profile of the probe tip or, more specifically, as a function of the radius of curvature, the aspect ratio (i.e. the height/base ratio of the probe) of the probe tip and the film thickness of the electroconductive thin film. Thus, if the electroconductive thin film has a large film thickness, the larger the aspect ratio and the smaller the radius of curvature of the probe tip, the smaller the width of micro-wires/grooves that can be micro-worked for forming a pattern. However, since there is a limit for the strength of the probe tip that can bear the force applied to it during the micro-cutting operation, the smallest width of micro-wires/grooves that can be micro-worked for forming a pattern is equal to or slightly greater than the film thickness if the probe tip has a radius of curvature of about 10 nm which represents the currently available smallest value.

Figure 2:
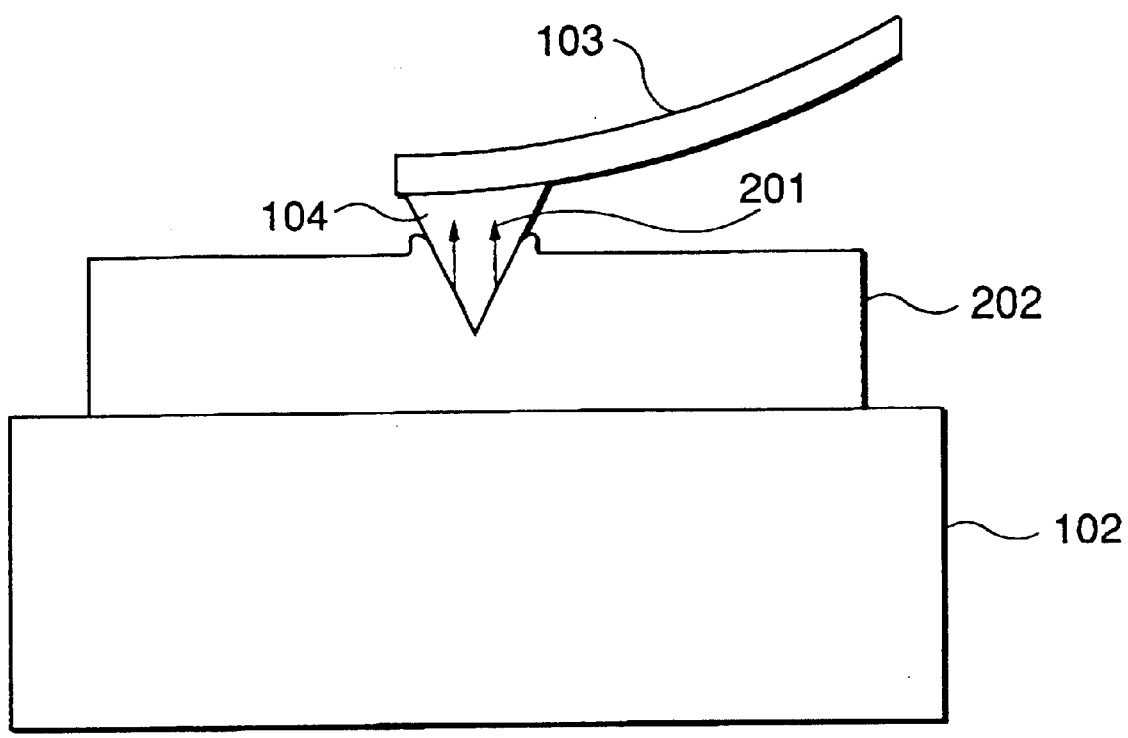
FIG. 2 is a schematic side view of a relatively thick film being subjected to a micro-cutting work, using a method according to the invention.

On the other hand, as the electroconductive thin film is cut deeper by the probe in the micro-cutting operation, the stress applied to the probe by the electroconductive thin film increases. Referring to FIGS. 2 and 3, a relatively thick electroconductive film 202 (FIG. 2) will give a larger stress 201 to the probe than a relatively thin electroconductive film (FIG. 3). Thus, a relatively thick electroconductive film will require a large contact force to be applied to it when it is cut in the pattern forming operation and a large contact force can result in a damaged tip of the probe. Hence, desirably a thin electroconductive film is used for the purpose of the invention.

In view of the above discussion, for the purpose of the invention, it is necessary that the electroconductive thin film has a film thickness not exceeding 20 nm, preferably 10 nm in order for it to be processed to show a width of less than 30 nm for. micro-wires/grooves. In an experiment using this embodiment, it was possible to produce a micro-pattern comprising electroconductive micro-wires 113 or insulating micro-grooves 114 having a width of 10 nm on an electroconductive thin film having a film thickness of 10 nm by means of a method using a probe 104 provided with a tip having a radius of curvature of 10 nm as will be in greater detail hereinafter.

Generally, while various techniques can be used for preparing thin films, including evaporation, sputtering and epitaxial growth, it is difficult to prepare a homogeneous and flat electroconductive thin film having a film thickness less than 20 nm on an insulator with any of these techniques.

Now, methods that can be used for preparing an electroconductive thin film 101 for the purpose of the invention will be described in detail.

Figure 4A:
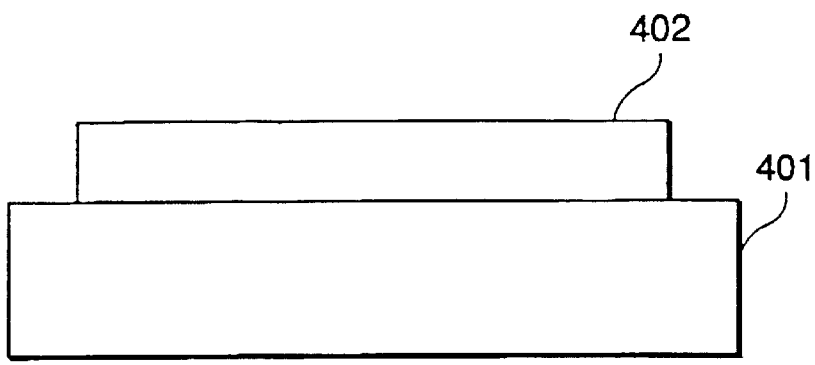
FIGS. 4A, 4B and 4C are schematic side views of a thin film being formed by means of a method of preparing an electroconductive thin film and a micro-working process, showing the thin film in different preparing steps as used in the first embodiment that will be described hereinafter.
Figure 4B:
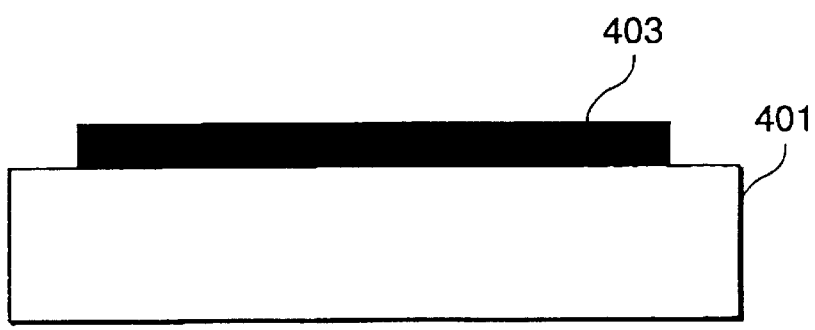
Figure 4C:
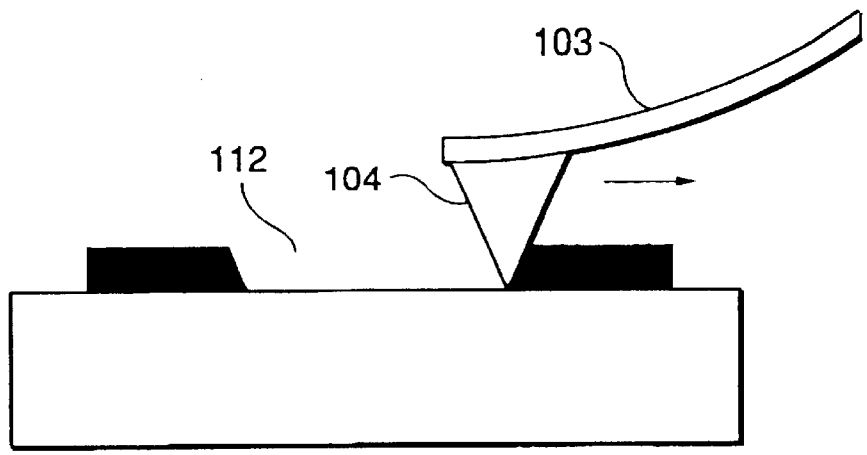

FIGS. 4A to 4C are schematic side views of a thin film being formed by means of a method of preparing an electroconductive thin film and a micro-working process, showing the thin film in different preparing steps as used in the first embodiment. In FIG. 4A, reference numerals 401 and 402 denote respectively an insulating substrate and an LB (Langmuir-Blodgett) film formed on the insulating substrate 401.

An LB film is an ultrathin film that can be prepared by building up monomolecular films of an organic material by means of a method as will be described below.

Figure 5A:
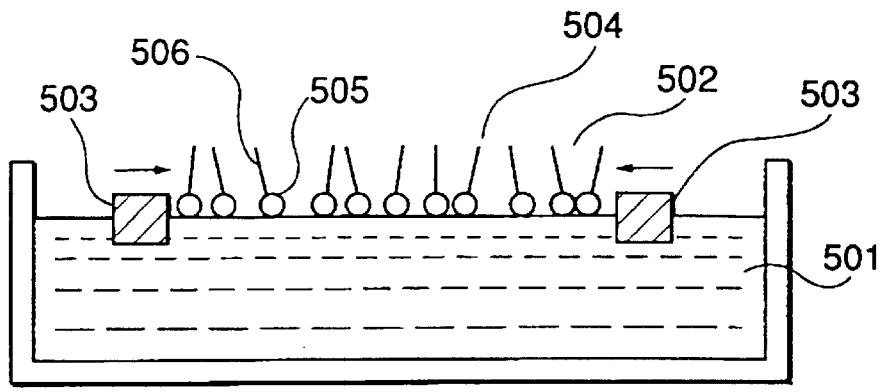
FIGS. 5A and 5B are schematic cross sectional side views of a film forming apparatus for forming an LB film.
Figure 5B:
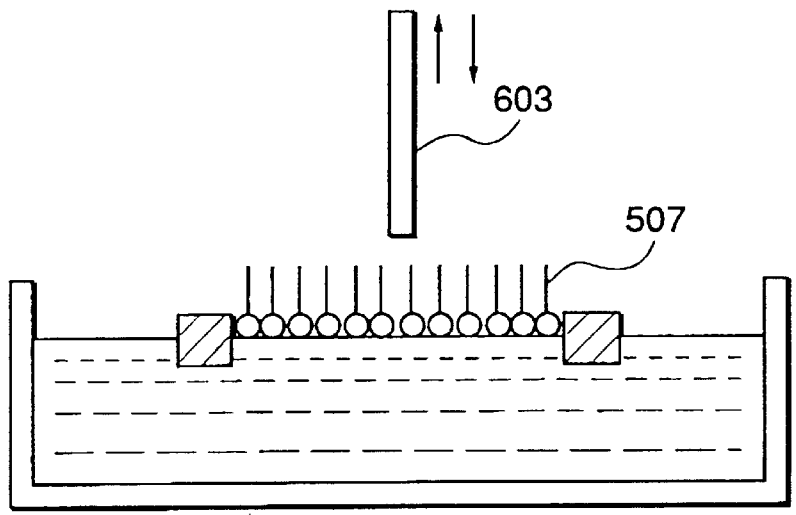

An amphiphilic organic compound having a hydrophobic site such as a saturated or unsaturated hydrocarbon group or a condensed polycyclic aromatic group and a hydrophilic site such as a carboxyl group or an ester group is dissolved into a solvent which may be chloroform or benzene. Then, the solution is developed on an aqueous phase 501 by means of an apparatus as shown in FIGS. 5A and 5B in such a way that each of the molecules 504 of the organic compound faces its hydrophilic site 505 to the aqueous phase (downward) and its hydrophobic site 506 to the opposite direction (upward) (FIG. 5A).

Figure 6A:
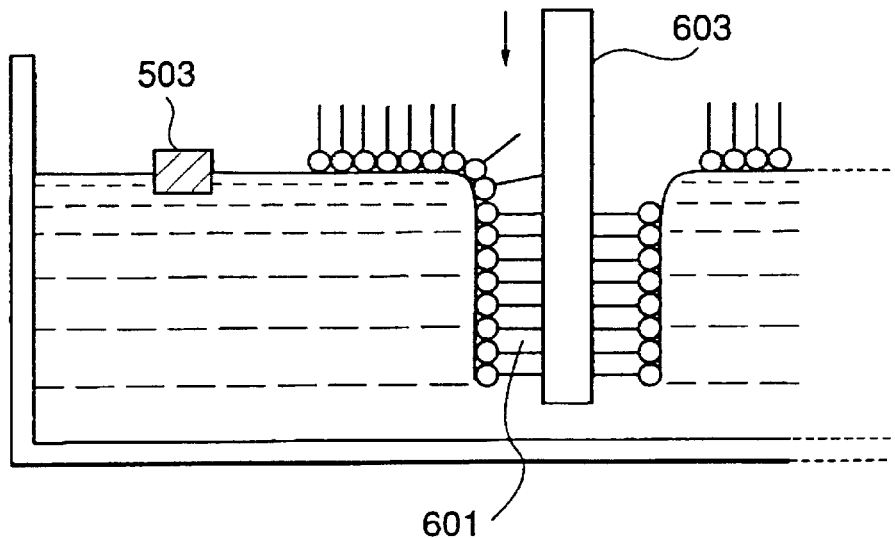
FIGS. 6A and 6B are enlarged schematic partial cross sectional side views of a film forming apparatus for forming an LB film, showing different film forming steps.
Figure 6B:
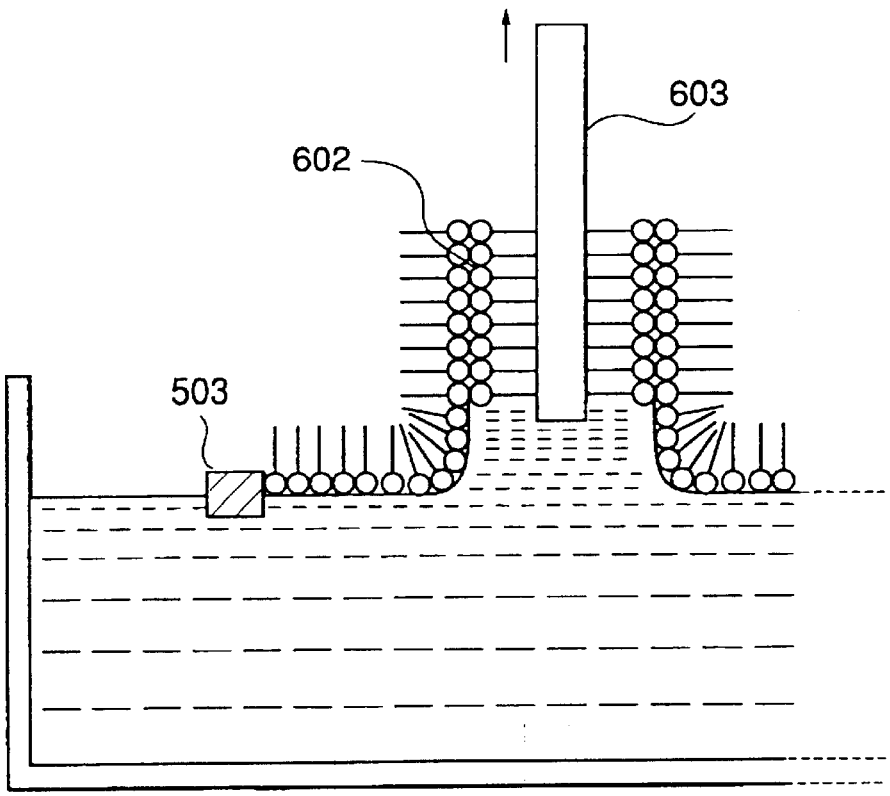
Figure 7A:
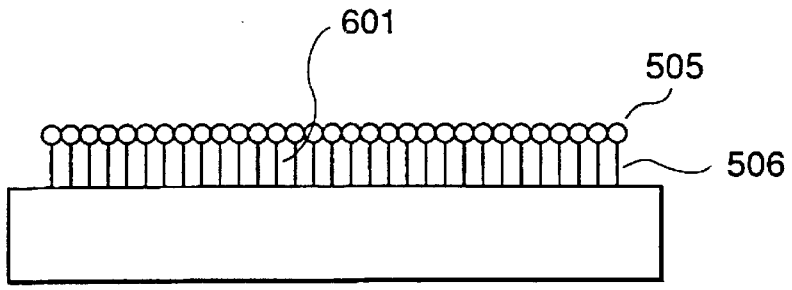
FIGS. 7A and 7B are schematic side views of two different LB films, showing the respective configurations.

Partitions (or floats) 503 are arranged to prevent the developed film 502 from being diffused too far on the aqueous phase 501 and limit the area of development for the film 502 so that the molecules 504 of the organic compound can be controlled for the state of accumulation and then the surface pressure corresponding to that state of accumulation will be detected. The state of accumulation can be controlled by moving the partitions 503 and hence by modifying the area of development of the organic compound in such a way that the surface pressure is raised gradually to a level good for producing a monomolecular film 507 of the organic compound on the aqueous phase (FIG. 5B). Then, while maintaining the surface pressure, a clean substrate 603 is lowered (FIG. 6A) or raised (FIG. 6B) vertically and quietly to transfer the monomolecular film 601 or the built-up film 602 of the organic compound onto the substrate 603. Thus, as schematically illustrated in FIG. 7A, molecules are arranged in an orderly manner in a monomolecular film 601 prepared in this way.

Figure 7B:
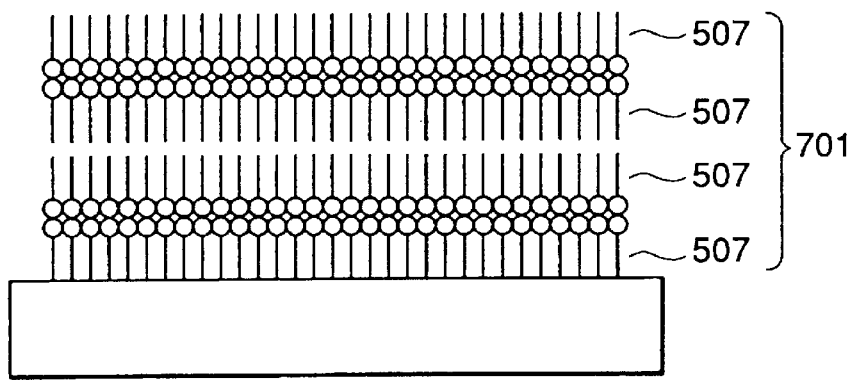

Then, a built-up film can be prepared by repeating the above process and sequentially laying a predetermined number of such monomolecular films (layers) 601 one on the other. FIG. 7B shows a built-up film 701 comprising a total of four monomolecular films (layers).

Thus, the thickness of an LB built-up film can be controlled by appropriately selecting the organic compound of the film and the number of layers for producing the built-up film. For example, when arachidic acid is used as organic compound, the film thickness of a monomolecular film is about 2.5 nm and hence a 20 nm thick built-up film can be obtained by laying a total of 8 monomolecular films.

The LB film 402 produced on the insulating substrate 401 in the above described manner (see FIG. 4A) is then baked to turn the LB film 402 into an amorphous carbon or graphite film, which is the electroconductive thin film 403 on the insulating substrate 402 in FIG. 4B.

Now, the baking process will be described below. Note that an infrared lamp heater (QHC-P610C: trade name, available from Shinku Ricoh) was used in the experiment conducted for this embodiment. For the purpose of the invention, the organic compound may be carbonized only partly or preferably entirely at temperature between 600° C. and 3,000° C. Amorphous carbon will be produced when the baking temperature is low within the above temperature range, whereas graphite will be obtained when the LB film is baked at temperature above 1,800° C. While flawless graphite may be obtained by baking the LB film at relatively high temperature, relatively low temperature should be selected for the baking process from the viewpoint of preparing a desired electric device according to the invention, taking the thermal resistance of the insulating substrate 401, the metal wiring pattern formed on the insulating substrate in the preceding process and other related components into consideration. All in all, the baking temperature is between 600° C. and 1,500° C., preferably between 600° C. and 1,000° C. The baking process is desirably conducted in an atmosphere containing oxygen only slightly, e.g., in vacuum or in a nitrogen atmosphere.

When an LB film is baked in a baking process as described above, the film thickness of the electroconductive thin film obtained as a result of baking will be reduced to about a half to a quarter of that of the LB film before the baking process. Generally, the film thickness will be reduced to a half at temperature between 600° C. and 1,000° C. and even further when baked at higher temperature. in the case of an arachidic acid LB film having a film thickness of 20 nm, an about 10 nm thick electroconductive thin film will be obtained after baking it at 800° C.

The obtained electroconductive thin film 403 on the insulating substrate 401 is then subjected to a micro-cutting process for producing a micro-pattern 112 where the tip of a probe 104 held by a cantilever 103 is brought to contact with it with a predetermined contact force and they are moved relative to each other (FIGS. 1 and 4C).

While an appropriate value should be selected for the contact force to be applied for the micro-cutting process, the value is a function of the film thickness of the electroconductive thin film, the baking temperature, the radius of curvature of the probe tip and the material of the probe. A large contact force should be used for an electroconductive film having a relatively large film thickness as described above by referring to FIG. 2. Also a large contact force should be used when a probe tip having a large radius of curvature is used because the probe receives a large stress from the electroconductive thin film during the micro-cutting process. Finally, a large contact force should be used when high baking temperature is selected because the electroconductive thin film will become rather hard at such temperature. However, if the probe is made of a relatively fragile material such as Si or $SiO_2$, the probe will be damaged at the tip to increase the radius of curvature of the tip when such a large contact force is applied to it. Then, such a probe will not feasibly be used for producing a micro-pattern. Additionally, when the probe shows a large radius of curvature at the tip, the stress it receives from the electroconductive thin film is raised to make it impossible to cut the thin film properly down to the substrate. While a probe made of a relatively hard material such as diamond, $Si_3N_4$ or SiC may be less fragile and will not be damaged at the tip so easily during the micro-cutting process, it is not totally free from the problem of a damaged tip when the contact force is significantly large.

Taking the above into consideration, a contact force between $3\times10^{-6}$N and $3\times10^{-4}$N, preferably between $3\times10^{-5}$N and $3\times10^{-4}$N should be selected for this embodiment.

Thus, a contact force appropriate for the micro-cutting process can be applied between the tip of the probe 104 and the electroconductive thin film 101 by driving the z-directional drive device 107 as shown in FIG. 1. Note that the relationship among the height of the probe 104 along the z-direction (typically between 1 and 30 $\mu$m), the length of the cantilever 103 (typically between 30 and 500 $\mu$m), the angle between the electroconductive thin film and the cantilever 103 (typically between 0 and 45°), the modulus of elasticity of the free end of the cantilever 103 in terms of deflection along the z-direction and the largest drive distance of the z-directional drive device (typically between 5 and 50 m when a piezoelectric device is used for it as is often the case) should be taken into consideration. If the modulus of elasticity is small, only the cantilever 103 may be deflected and the corresponding side (between the free end and the fixed end) or the fixed end of the cantilever 103 may be brought into contact with the electroconductive thin film 101 or the z-directional drive device may reach its drive limit before the z-directional drive device is driven over a large distance in order to realize a large contact force required for the micro-cutting operation.

While this problem may not occur when a large modulus of elasticity is selected for the cantilever 103, a too large modulus of elasticity can give rise to an excessively large contact force between the probe 104 and the electroconductive thin film 101 that can by turn cause the probe to faultily cut the surface of the electroconductive thin film in a wrong way during the AFM scanning operation for detecting the right spot to be micro-worked particularly when dirt and flaws are found on the surface.

In view of the above, the modulus of elasticity of the free end of the cantilever 103 in terms of deflection along the z-direction should be between 3 and 300N/m, preferably between 10 and 100N/m.

In an experiment using this embodiment, where a probe made of $Si_3N_4$ and having a radius of curvature of 10 nm at the tip is employed to cut a 10 nm thick electroconductive thin film obtained by baking an arachidic acid LB film with a contact force of $3\times10^{-5}$N, a micro-pattern of micro-wires and micro-grooves having a width of 10 nm could be produced. The modulus of elasticity of the cantilever was 30N/m and the drive distance of the piezoelectric device used for the z-directional drive device to produce the required contact force for the micro-cutting was 1 $\mu$m.

Note that the above described micro-working process of micro-cutting a baked LB film by means of the tip of a probe held by a cantilever to be in contact with the LB film by applying a predetermined contact force thereto is a direct machining process that is free from a post-process such as a process of photographic development so that it can produce a finely defined pattern that is free from blurs.

Second Embodiment

Figure 8A:
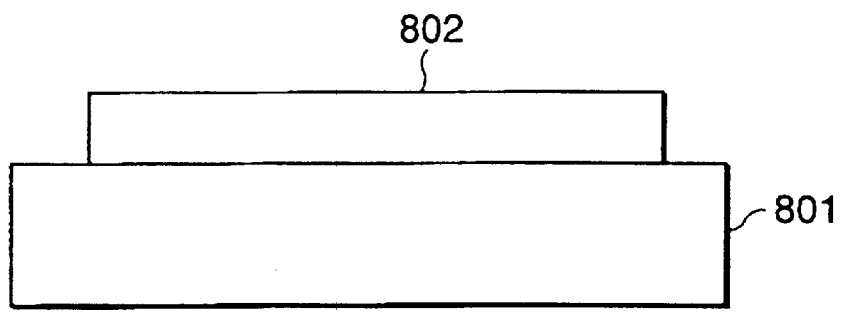
FIGS. 8A, 8B and 8C are schematic side views of a thin film being formed by means of a method of preparing an electroconductive thin film and a micro-working process, showing the thin film in different preparing steps as used in the second embodiment that will be described hereinafter.
Figure 8B:
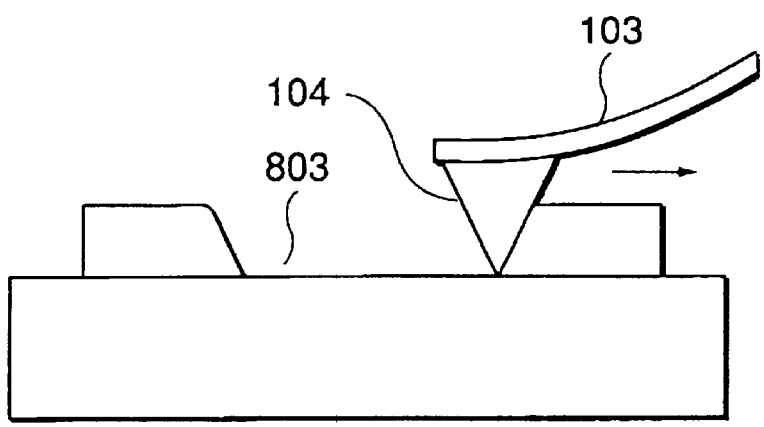
Figure 8C:
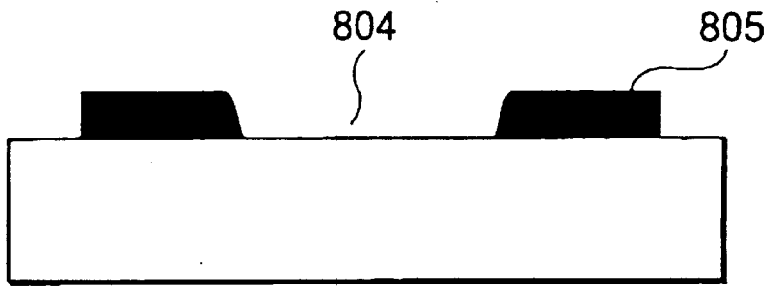

FIGS. 8A to 8C are schematic side views of a thin film being formed by means of a method of preparing an electroconductive thin film and a micro-working process, showing the thin film in different preparing steps as used in the second embodiment of the invention. In this embodiment, an LB film is firstly subjected to a micro-cutting process and subsequently baked to produce an electroconductive micro-pattern.

In FIG. 8A, there are shown an insulating substrate 801 and an LB film 802 prepared on the insulating substrate 801. The method described above by referring to the first embodiment is also used for preparing an LB film for this embodiment. A micro-cutting process as used for cutting an electroconductive thin film (baked LB film) for the first embodiment is also used for micro-cutting an LB film for this embodiment. A micro-machined pattern 803 can be produced on the LB film 802 by moving the probe 104 relative to the LB film 802 along the x- and y-directions, applying a predetermined contact force between them and using the apparatus of FIG. 1 (FIG. 8B). This embodiment differs from the first embodiment in terms of the values selected for the contact force between the probe 104 and the LB film 802 and the modulus of elasticity of the cantilever 103.

Since an LB film is softer before a baking process than after it, a relatively small value can be selected for the contact force required for the micro-cutting operation of this embodiment. Taking this and the requirements to be met for avoiding a damaged probe tip as described above by referring to the first embodiment into consideration, a contact force between $3 \times 10^{-5}$N and $3 \times 10^{-4}$N, preferably between $1 \times 10^{-7}$N and $1 \times 10^{-4}$N should be selected for this embodiment.

Thus, considering the possible damage that can be done on the LB film during the AFM scanning operation for detecting the right spot to be micro-worked, the modulus of elasticity of the free end of the cantilever 103 in terms of deflection along the z-direction should be smaller than that of the first embodiment. In view of the contact force during the micro-cutting operation, the largest drive distance of the z-directional drive device, the length of the cantilever and the height of the probe put together as in the case of the first embodiment, the modulus of elasticity of the cantilever of the embodiment should be between 0.03 and 3N/m, preferably between 0.1 and 1N/m.

Then, the LB film 802 on the insulating substrate 801 that is now carrying thereon a macro-worked pattern 803 (FIG. 8B) is subjected to a baking process to turn the substance of the LB film 802 into amorphous carbon or graphite to produce an electroconductive thin film 805 having a micro-worked pattern 804 and arranged on the insulating substrate 801 (see FIG. 8C).

In an experiment using this embodiment, a total of eight monomolecular films of arachidic acid are built up on a quartz substrate by means of the LB technique. The built-up film showed a film thickness of 20 nm. Then, a probe made of $Si_3N_4$ and having a radius of curvature of 10 nm at the tip is employed to cut the thin film with a contact force of $3 \times 10^{-7}$N to produce a micro-pattern of micro-wires and micro-grooves having a width of 10 nm. The modulus of elasticity of the cantilever was 0.3N/m and the drive distance of the piezoelectric device used for the z-directional drive device to produce the required contact force for the micro-cutting was 1 μm.

Then, the LB film carrying the micro-pattern obtained by the micro-cutting was baked at 800° C. to produce an about 10 nm thick electroconductive thin film now carrying an electroconductive micro-pattern of micro-wires and micro-grooves having a width of 15 nm.

With this embodiment, an LB film is micro-processed by means of a probe held by a cantilever and applying a predetermined contact force between them before the film is baked so that only a reduced contact force is required for the micro-cutting operation to produce an electroconductive micro-pattern. Thus, the tip of the probe is less apt to be damaged.

Third Embodiment

Figure 9A:
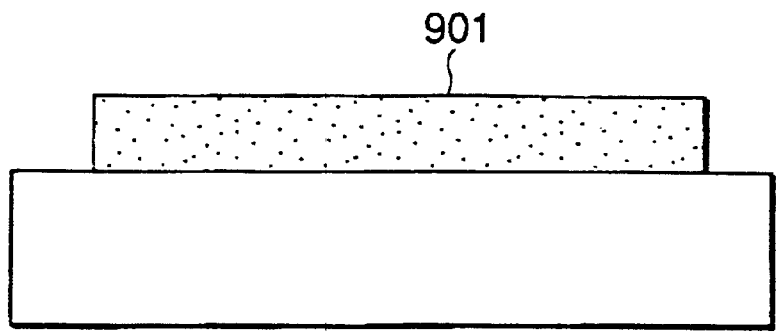
FIGS. 9A, 9B and 9C are schematic side views of a thin film being formed by means of a method of preparing an electroconductive thin film and a micro-working process, showing the thin film in different preparing steps as used in the third embodiment that will be described hereinafter.
Figure 9B:
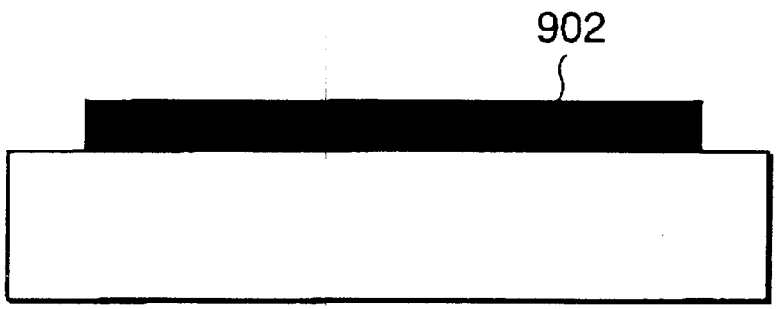
Figure 9C:
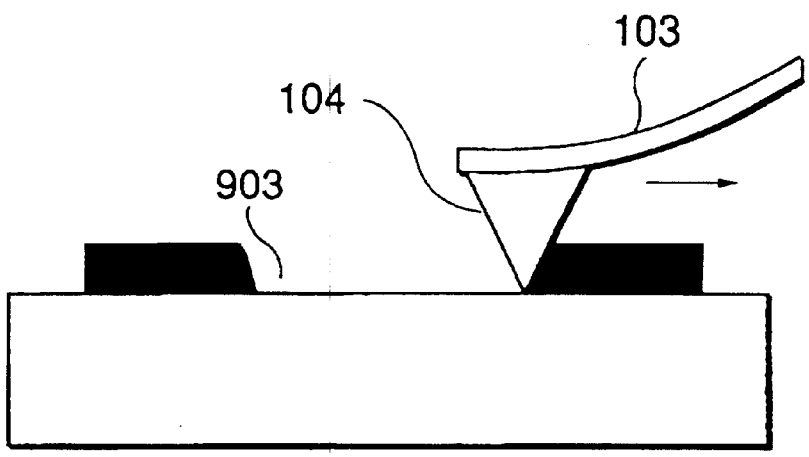

FIGS. 9A to 9C are schematic side views of a thin film being formed by means of a method of preparing an electroconductive thin film and a micro-working process, showing the thin film in different preparing steps as used in the third embodiment of the invention. In this embodiment, a metal thin film (electroconductive thin film) 902 obtained by baking an LB film containing metal is subjected to a micro-cutting process to produce an electroconductive micro-pattern 903.

As organic compound to be used for preparing a metal containing LB film of this embodiment, an organic metal complex described in Japanese Patent Application Laid-Open No. 8-104810 and expressed by the general formula below

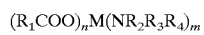

[where $R_1$ represents an alkyl group, each of $R_2$, $R_3$ and $R_4$ represents a hydrogen atom, an alkyl group or an alkenyl group, M represents a metal and each of n and m represents an integer equal to or greater than 1] will be selected as it has a metal atom, a hydrophobic part and a hydrophilic part in a single molecule.

An LB film 901 is formed on an insulating substrate, using the above material, as in the case of the preceding embodiments (FIG. 9A). Thereafter, the LB film is irradiated with ultraviolet rays in an $O_3$ atmosphere to decompose the organic moiety of the organic material of the LB film. Then, the LB film is heated and baked at about 300° C. in an $H_2$ atmosphere. As a result, only the metal M in the organic compound is left on the substrate to produce a metal thin film 902 (FIG. 9B).

Then, the metal thin film 902 is subjected to a micro-cutting process, which is same as the one used on an electroconductive thin film (baked LB film) for the first embodiment. A micro-machined pattern 903 can be produced on the metal thin film 902 by moving the probe 104 relative to the metal thin film 902 along the x- and y-directions, applying a predetermined contact force between them and using the apparatus of FIG. 1. This embodiment differs from the first embodiment in terms of the values selected for the contact force between the probe 104 and the metal thin film 902 and the modulus of elasticity of the cantilever 103.

The contact force to be applied to the metal thin film 902 for a micro-cutting operation varies depending on the type of the metal. For example, metals such as Au and Al can be micro-cut with a relatively small contact force (up to $1 \times 10^{-5}$N). On the other hand, a large contact force will be required for micro-cutting metals such as W and Ti, which is so large that it requires a large radius of curvature for the probe tip, for preventing the breakage of the tip, that makes a micro-cutting operation of producing 10 nm wide micro-wires and micro-grooves practically impossible. Thus, for micro-cutting a metal thin film 902 for this embodiment, the use of an organic compound containing a relatively soft metal M such as Au or Al is preferable.

While the level of contact force to be used for the micro-cutting operation of this embodiment may vary depending on the metal, a contact force between $3 \times 10^{-7}$N and $3 \times 10^{-4}$N, preferably between $1 \times 10^{-6}$N and $1 \times 10^{-4}$N should be selected when a relatively soft metal is selected.

Thus, in view of the possible damage that can be done on the metal thin film 902 during the AFM scanning operation for detecting the right spot to be micro-worked, the contact force during the micro-cutting operation, the largest drive distance of the z-directional drive device, the length of the cantilever and the height of the probe put together as in the case of the preceding embodiments, the modulus of elasticity of the cantilever of the embodiment should be between 1 and 100N/m, preferably between 3 and 30N/m.

Note that the above described micro-working process of micro-cutting a metal thin film obtained by baking an LB film containing a metal by means of the tip of a probe held by a cantilever to be in contact with the metal thin film by applying a predetermined contact force thereto is a direct machining process that is free from a post-process such as a process of photographic development so that it can produce a finely defined pattern that is free from blurs. Further, since this embodiment provides a finely worked pattern of metal, an electric device comprising such a pattern is advantageous in that it shows a relatively low electric resistance, emits less heat and hence consumes power only at a reduced rate.

Also note that, while a metal thin film is produced by baking an LB film containing a metal in a baking process and then subjected to a micro-cutting process in the above description, alternatively the micro-cutting process may be conducted prior to the baking process for the purpose of the invention. In other Words, an LB film containing a metal may be subjected to a micro-cutting process and then baked to produce a finely worked electroconductive pattern.

This procedure will provide an advantage that the probe tip is less liable to be damaged because only a relatively small contact force is required for the micro-cutting, as in the case of the second embodiment, in addition to the above pointed out advantage of a low electric resistance, a low heat emission level and a low power consumption rate.

Fourth Embodiment

An electric device can be prepared by using a method of preparing an electroconductive micro-pattern described above by referring to any of the first through third embodiments.

Figure 10A:
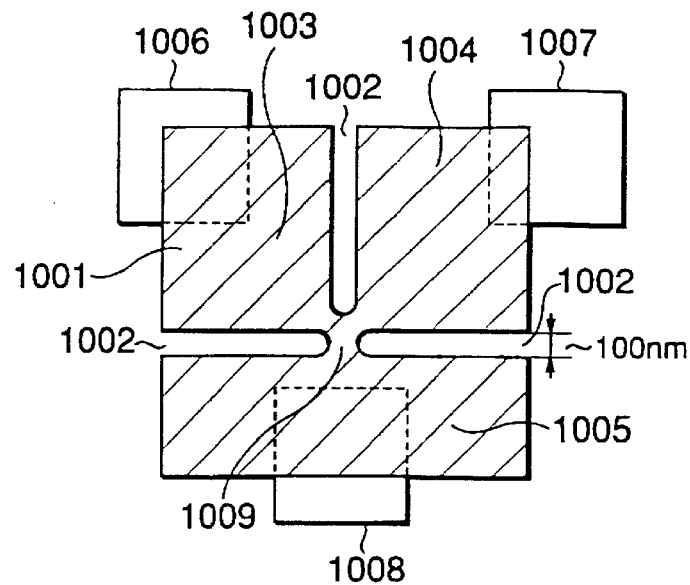
FIGS. 10A and 10B are schematic cross sectional views of an electric device prepared by means of a method of forming an electroconductive micro-pattern as used in the fourth embodiment that will be described hereinafter.
Figure 10B:
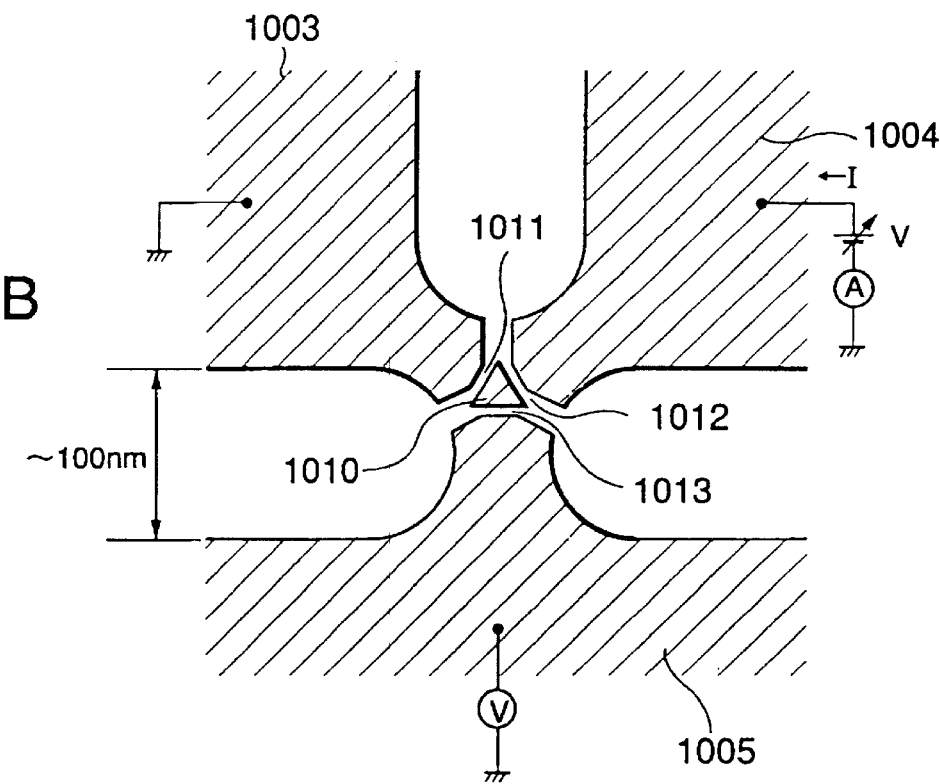

FIGS. 10A and 10B are schematic views of an electric device prepared by means of a method of forming an electroconductive micro-pattern as used in this fourth embodiment.

FIG. 10A is a schematic view showing the entire device carrying a pattern as large as 100 nm or more prepared by a known micro-working technique such as electron beam processing, photolithography or focused ion beam processing.

Referring to FIG. 10A, there are shown three 100 nm wide grooves 1002 formed in a 2 $\mu$m×2 $\mu$m square electroconductive thin film 1001 on an insulating substrate by means of electron beam processing. Thus, the electroconductive thin film 1001 is divided into a source electrode 1003, a drain electrode 1004 and a gate electrode 1005 by the grooves 1002, which electrodes are connected to a source electrode pad 1006, a drain electrode pad 1007 and a gate electrode pad 1008 respectively for external signal input/output operations.

The source electrode 1003, the drain electrode 1004 and the gate electrode 1005 are electrically connected to each other at a 100 nm large junction area 1009. FIG. 10B is an enlarged schematic view of the junction area 1009.

At first micro-junction 1011, a second micro-junction 1012 and a third micro-junction 1013 are formed in the junction area 1009 as 10 nm wide grooves with a micro-working process according to any of the first through third embodiments to produce an micro-island electrode 1010 that is defined by the micro-junctions. Thus, the micro-island electrode 1010 is realized in the form of a regular triangle having about 30 nm long edges. In other words, the micro-island electrode 1010 is separated from the source electrode 1003, the drain electrode 1004 and the gate electrode 1005 by the first micro-junction 1011, the second micro-junction 1012 and the third micro-junction 1013 respectively, the micro-junctions 1011, 11012 and 1033 being about 10 nm wide.

As a voltage is applied between the source electrode 1003 and the drain electrode 1004 of the above electric device, an electron tunneling appears between the source electrode 1003 and the micro-island electrode 1010 and between the micro-island electrode 1010 and the drain electrode 1004. Since only a very small electric capacitance exists between the micro-island electrode 1010 and the source electrode 1003 and between the micro-island electrode 1010 and the drain electrode 1004, a Coulomb blockade phenomenon is observed in the device at room temperature so that, when a voltage V is applied between the source electrode 1003 and the drain electrode 1004, the electric current I that flows therebetween varies stepwise. Thus, the electric current flowing between the source electrode and the drain electrode can be modulated to a large extent by applying another electric signal v to the gate electrode 1005 under this condition. In other words, like a transistor, the three-terminal electric device can be used as an amplifying device or a switching device.

Fifth Embodiment

Figure 11A:
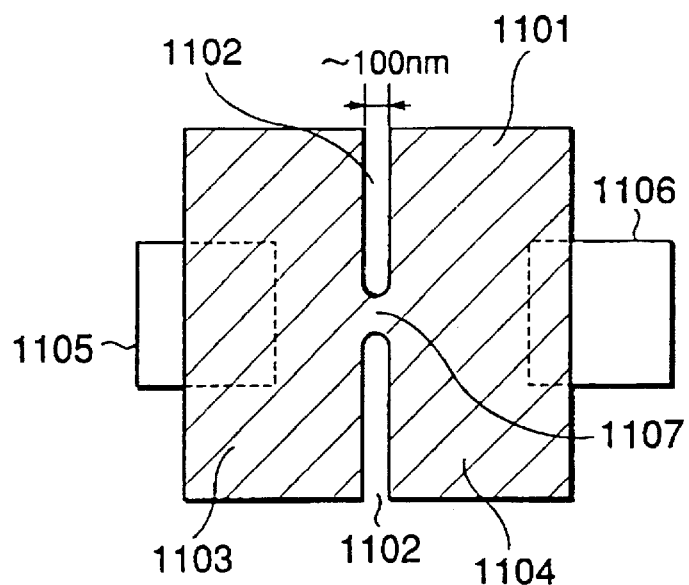
FIGS. 11A and 11B are schematic cross sectional views of an electric device prepared by means of a method of forming an electroconductive micro-pattern as used in the fifth embodiment that will be described hereinafter.
Figure 11B:
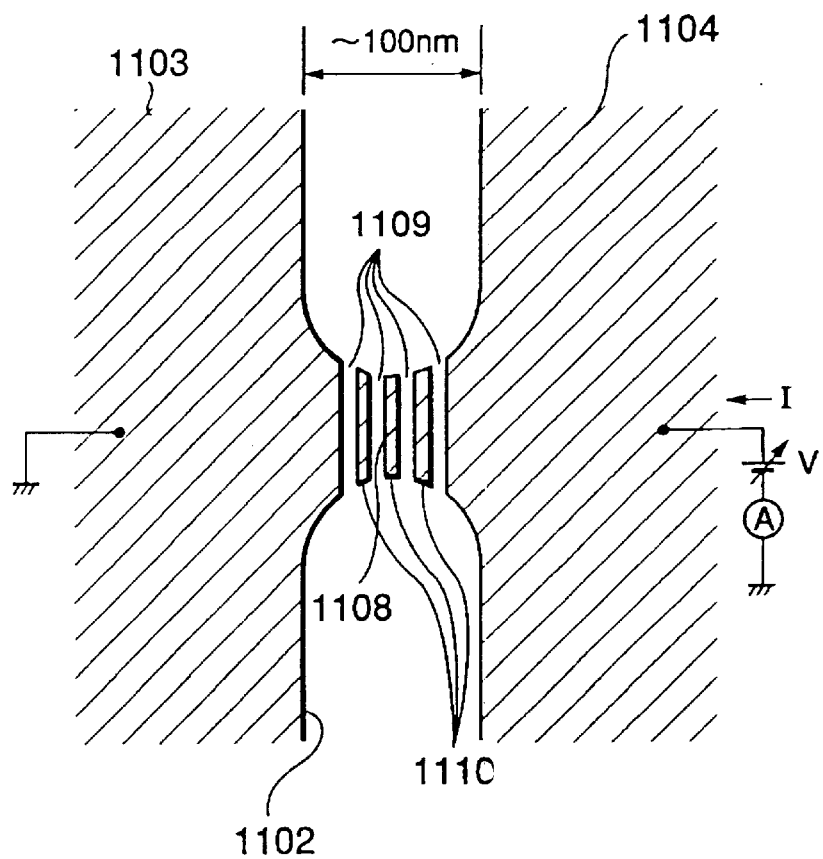

FIGS. 11A and 11B are schematic views of an electric device prepared by means of a method of forming an electroconductive micro-pattern as used in this fifth embodiment.

FIG. 11A is a schematic view showing the entire device carrying a pattern as large as 100 nm or more prepared by a known micro-working technique such as electron beam processing, photolithography or focused ion beam processing.

Referring to FIG. 11A, there are shown two 100 nm wide grooves 1102 formed in a 2 $\mu$m×2 $\mu$m square electroconductive thin film 1101 on an insulating substrate by means of electron beam processing. Thus, the electroconductive thin film 1101 is divided into a source electrode 1103 and a drain electrode 1104 by the grooves 1102, which electrodes are connected to a source electrode pad 1105 and a drain electrode pad 1106 respectively for external signal input/output operations.

The source electrode 1103 and the drain electrode 1104 are electrically connected to each other at a 100 nm large junction area 1107. FIG. 11B is an enlarged schematic view of the junction area 1107.

Then, a plurality of micro-island electrodes 1110 are prepared by using a plurality of micro-junctions 1109 in the form of a pattern of about 10 nm wide grooves and a plurality of about 10 nm wide islands by means of micro-working process according to any of the first through third embodiments to produce a micro-multi-stage tunnel junction 1108. Note that the micro-multi-stage tunnel junction 1108 comprises a plurality of 50 nm long and 10 nm wide strip-shaped micro-island electrodes 1110 arranged in parallel at regular intervals of about 10 nm. Thus, the source electrode 1103 and the drain electrode 1104 are separated from each other by a micro-multi-stage tunnel junction 1108.

As a voltage is applied between the source electrode 1103 and the drain electrode 1104 of the above electric device, electron tunneling appears at the micro-multi-stage tunnel junction 1108 between the source electrode 1103 and drain electrode 1104. Since the electrodes are arranged at a regular pitch of about 20 nm in the micro-multi-stage tunnel junction 1108, which is substantially equal to the wavelength of electron, interference phenomenon is observed in the device at room temperature as tunneling of electrons occurs. The electric current flowing between the source electrode 1103 and the drain electrode 1104 shows a negative resistance characteristic relative to the voltage being applied between the source electrode 1103 and the drain electrode 1104 under this condition. In other words, the two-terminal electric device can be used as an oscillator or a switching device.

Sixth Embodiment

Figure 12A:
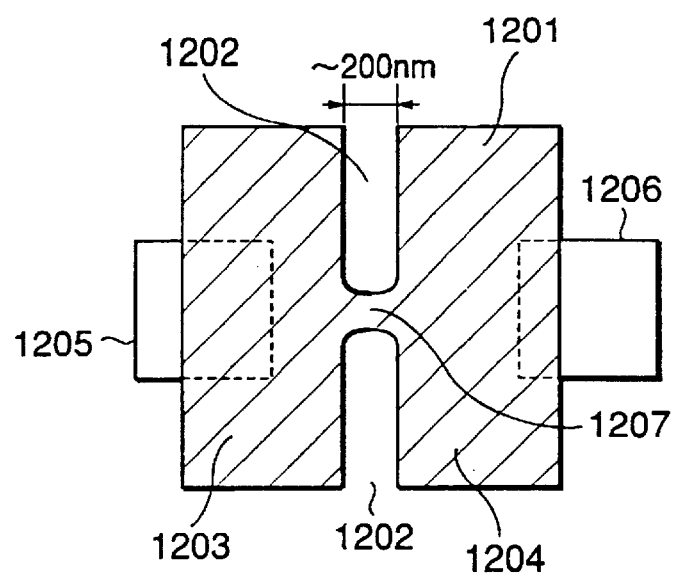
FIGS. 12A and 12B are schematic cross sectional views of an electric device prepared by means of a method of forming an electroconductive micro-pattern as used in the sixth embodiment that will be described hereinafter.
Figure 12B:
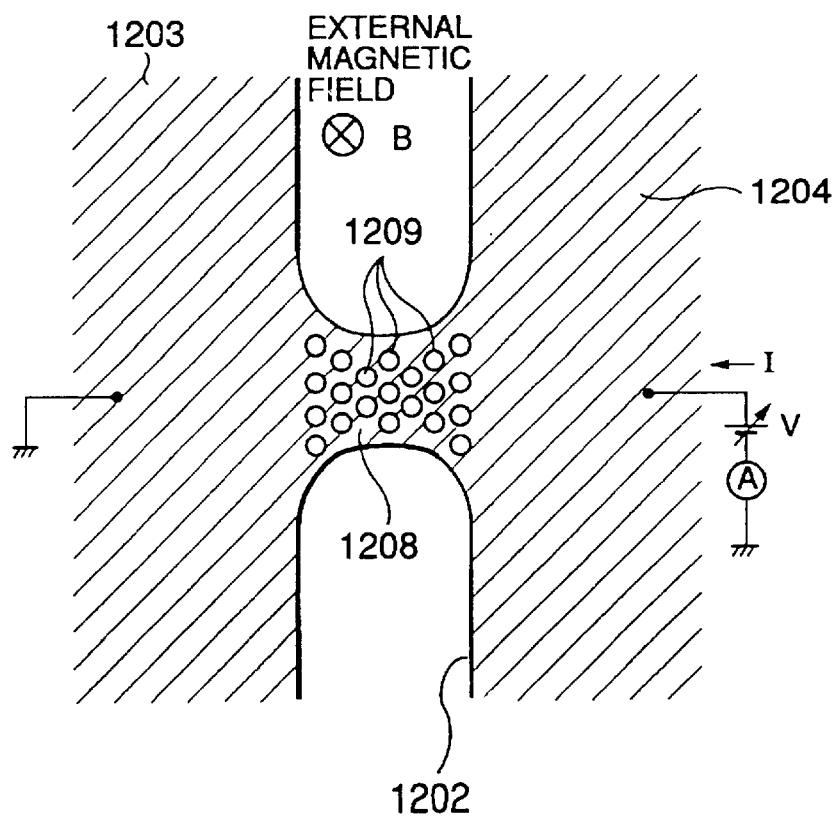

FIGS. 12A and 12B are schematic views of an electric device prepared by means of a method of forming an electroconductive micro-pattern as used in this sixth embodiment.

FIG. 12A is a schematic view showing the entire device carrying a pattern as large as 100 nm or more prepared by a known micro-working technique such as electron beam processing, photolithography or focused ion beam processing.

Referring to FIG. 12A, there are shown two 200 nm wide grooves 1202 formed in a 2 μm×2 μm square electroconductive thin film 1201 on an insulating substrate by means of electron beam processing. Thus, the electroconductive thin film 1201 is divided into a source electrode 1203 and a drain electrode 1204 by the grooves 1202, which electrodes are connected to a source electrode pad 1205 and a drain electrode pad 1206 respectively for external signal input/output operations.

The source electrode 1203 and the drain electrode 1204 are electrically connected to each other at a 200 nm long junction area 1207. FIG. 12B is an enlarged schematic view of the junction area 1207.

Then, a plurality of micro-holes 1209 having a diameter of about 10 nm are formed regularly and periodically arranged on a two-dimensional plane by means of micro-working process according to any of the first through third embodiments to produce a two-dimensional anti-dot lattice 1208. The anti-dot lattice 1208 as shown in FIG. 12B has micro-holes having a diameter of about 10 nm and arranged at regular intervals of about 10 nm to form a hexagonal lattice. Alternatively, a tetragonal lattice may be used for the purpose of the invention.

Then, the electric device is subjected to an external magnetic field B directed along the normal line of the substrate while applying a voltage between the source electrode 1203 and the drain electrode 1204 to flow an electric current through the two-dimensional anti-dot lattice 1208. Under this condition, electrons passing through the two-dimensional anti-dot lattice 1208 shows a cyclotron motion due to the external magnetic field applied to the device. The magnetic resistance of the device will increase when the cyclotron diameter of electrons coincides with the dot arrangement pitch of the two-dimensional anti-dot lattice as electrons fall into the localized orbits to circulate around the anti-dots under this condition. Since the dot arrangement pitch of the above described two-dimensional anti-dot lattice is about 20 nm, which is substantially equal to the wavelength of electron, an increase in the magnetic resistance is observed in the device at room temperature. In other words, the two-terminal electric device can be used as a switching device that operates under the effect of a magnetic field.

As described in detail above, according to the invention, a micro-pattern can be prepared in the form of micro-wires and micro-grooves with a width of 30 nanometers or less on an insulating substrate carrying thereon an ultra-thin film having a very smooth surface and a thickness of about 20 nm or less by means of a process comprising steps of sequentially forming an ultra-thin organic film on an insulating substrate, micro-cutting the organic thin film by holding a probe in contact with the organic thin film with a predetermined contact force and heating and baking the micro-worked organic thin film or steps of sequentially forming an ultra-thin organic film on an insulating substrate, heating and baking the organic thin film and micro-cutting the baked organic thin film by holding a probe in contact with the organic thin film with a predetermined contact force. Such micro-patterns can be reliably prepared with an enhanced level of reproducibility.

According to the invention, a quantum effect electron device can be prepared as an electric device formed by means of a micro-pattern produced by a method according to the invention. Such quantum effect electron devices can be reliably prepared with an enhanced level or reproducibility and operate properly at room temperature.

What is claimed is:

1. A method of forming an electroconductive micro-pattern on an insulating substrate, comprising the steps of:

forming an organic thin film by building up monomolecular films on a surface of the insulating substrate;

baking the organic thin film to turn the organic thin film into an amorphous carbon or graphite film, thereby providing an electroconductive thin film; and processing the electroconductive thin film by performing a micro-cutting operation thereon to form the electroconductive micro-pattern, wherein the electroconductive thin film provided in the baking step is reduced in thickness to ½ to ¼ as compared to the thickness of the organic thin film before the baking step, the film thickness being smaller than a width of the micro-pattern, and has a lower hardness than the insulating substrate, and wherein the micro-cutting operation comprises a step of causing a relative motion of a probe having a tip with respect to and along the surface of the insulating substrate while applying a contact force on the probe to such an extent that the tip moves into the electroconductive thin film until the tip gets to the surface of the insulating substrate, thereby to cut the electroconductive film.

2. The method according to claim 1, wherein the contact force of the probe applied to the electroconductive thin film is between $3\times10^{-6}$ and $3\times10^{-4}$ N.

3. The method according to claim 1, wherein the electroconductive thin film is a metal thin film.

4. The method according to claim 3, wherein the contact force of the probe applied to the thin film is between $3\times10^{-7}$ and $3\times10^{-4}$ N.

5. The method according to claim 1, wherein the baking step is performed at a temperature between 600° C. and 3000° C.

* * * * *

UNITED STATES PATENT AND TRADEMARK OFFICE
CERTIFICATE OF CORRECTION

PATENT NO. : 6,640,433 B1
DATED : November 4, 2003
INVENTOR(S) : Ryo Kuroda et al.

It is certified that error appears in the above-identified patent and that said Letters Patent is hereby corrected as shown below:

Column 5,
Line 40, "for." should read -- for --.

Column 7,
Line 10, "in the" should read -- ¶ In the --;
Line 49, "$3\times10^-$" should read -- $3\times10^{-5}N.$ --; and
Line 50, "$_5N.$" should be deleted.

Column 10,
Line 30, "$1\times10^-$" should read -- $1\times10^{-5}N).$ --; and
Line 31, "$_5N).$" should be deleted.

Column 11,
Line 43, "At" should read -- A --; and
Line 55, "1033" should read -- 1013 --.

Signed and Sealed this

Sixth Day of April, 2004

JON W. DUDAS
*Acting Director of the United States Patent and Trademark Office*